US011265019B1

(12) United States Patent
Ebrahimzad et al.

(10) Patent No.: US 11,265,019 B1
(45) Date of Patent: Mar. 1, 2022

(54) PARALLEL POLAR CODE WITH SHARED DATA AND COOPERATIVE DECODING

(71) Applicant: HUAWEI TECHNOLOGIES CO., LTD., Guangdong (CN)

(72) Inventors: Hamid Ebrahimzad, Ottawa (CA); Zhuhong Zhang, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/108,176

(22) Filed: Dec. 1, 2020

(51) Int. Cl.
H03M 13/00 (2006.01)
H03M 13/13 (2006.01)
H03M 13/09 (2006.01)

(52) U.S. Cl.
CPC ........... *H03M 13/13* (2013.01); *H03M 13/09* (2013.01)

(58) Field of Classification Search
CPC .... H03M 13/09; H03M 13/13; H03M 13/451; H04L 1/00; H04L 9/32
See application file for complete search history.

(56) References Cited

U.S. PATENT DOCUMENTS

| 8,769,373 | B2* | 7/2014 | Rogers, Jr | G06F 21/572 |
| | | | | 714/758 |
| 2012/0281834 | A1* | 11/2012 | Reznik | H04L 25/0224 |
| | | | | 380/270 |
| 2015/0103956 | A1* | 4/2015 | Zeng | H04L 27/365 |
| | | | | 375/298 |
| 2016/0365977 | A1* | 12/2016 | Boutros | H03M 13/05 |
| 2018/0097580 | A1* | 4/2018 | Zhang | H03M 13/13 |
| 2019/0007165 | A1* | 1/2019 | Shen | H03M 13/13 |
| 2019/0036550 | A1 | 1/2019 | Koike-Akino | |
| 2019/0173657 | A1* | 6/2019 | Tomasi | H04L 1/1614 |
| 2020/0295787 | A1 | 9/2020 | Meller et al. | |
| 2020/0358556 | A1* | 11/2020 | Wesslen | H04L 1/0061 |
| 2020/0412479 | A1* | 12/2020 | Le | H04L 1/0041 |

FOREIGN PATENT DOCUMENTS

CN 109716692 A 5/2019
WO 2019087723 A1 5/2019

OTHER PUBLICATIONS

Zheng et al., "Polar Coding Strategies for the Interference Channel With Partial-Joint Decoding", IEEE Trans. IT., vol. 65, No. 4, 1973-1993, Apr. 2019. (Year: 2019).*

(Continued)

*Primary Examiner* — Shelly A Chase
*Assistant Examiner* — Enamul M Kabir
(74) *Attorney, Agent, or Firm* — BCF LLP

(57) ABSTRACT

The disclosed systems, structures, and methods are directed to encoding and decoding information for transmission across a communication channel. The method includes dividing the information between m parallel polar codes such that each of the m parallel polar codes includes a plurality of information bits, and splitting the information bits in each of the m parallel polar codes into a private part and a public part. The public part includes an information section and a repetition section, wherein the information bits of the public part are arranged in the information section. Bits in the information section of the public part of each of the m parallel polar codes are repeated in the repetition section of the public part of at least a second one of the m parallel polar codes.

20 Claims, 5 Drawing Sheets

(56) References Cited

OTHER PUBLICATIONS

Andersson et al., "Polar Coding for Bidirectional Broadcast Channels with Common and Confidential Messages", IEEE Journal, vol. 31, No. 9, pp. 1901-1908, Sep. 2013. (Year: 2013).*
Wilde et el., "Polar codes for private classical communication", ISITA2012, Honolulu, Hawaii, USA, pp. 745-759, Oct. 28-31, 2012 (Year: 2012).*
Arikan, "Channel polarization: A method for constructing capacity achieving codes for symmetric binary-input memoryless channels," IEEE Trans. Inf. Theory, vol. 55, pp. 3051-3073, Jul. 2009.
Tal et al., "List decoding of polar codes", IEEE Trans. IT, vol. 61, No. 5, pp. 2213-2226, May 2015.
El-Khamy et al., "Relaxed polar codes", IEEE Trans. IT, vol. 63, No. 4, pp. 1986-2000, Apr. 2017.
Koike-Akino et al., Irregular Polar Coding for Complexity-Constrained Lightwave Systems, Journal of lightwave tech, vol. 36, No. 11, 2018.
Sarkis et al., "Fast polar decoders: Algorithm and implementation," IEEE J. Sel. Areas Commun., vol. 32, No. 5, pp. 946-957, May 2014.
Hanif et al., "Fast successive-cancellation decoding of polar codes: Identification and decoding of new nodes", IEEE Commun. Lett., vol. 21, No. 11, pp. 2360-2363, Nov. 2017.
Hashemi et al., "Simplified successive cancellation list decoding of polar codes", in IEEE Int. Symp. on Inform. Theory, Jul. 2016, pp. 815-819.
Koopman, "32-Bit Cyclic Redundancy Codes for Internet Applications", from IEEE Xplore retrieved on Nov. 13, 2020.
R1-1714179, Samsung, Rate Matching Scheme for Polar Codes, 3GPP TSG RAN WG1 #90, Prague, Czechia Aug. 21-25, 2017.
International Search Report and Written Opinion of PCT/CN2021/108517; Shen, Li; dated Oct. 15, 2021.

* cited by examiner

PARALLEL POLAR CODE WITH SHARED DATA AND COOPERATIVE DECODING

CROSS-REFERENCE TO RELATED APPLICATIONS

This is the first filing related to the disclosed technology. At the time of filing, there are no related patents or applications.

FIELD OF THE INVENTION

The present disclosure relates generally to the field of encoding and decoding information for transmission over a noisy medium, and more particularly to systems and methods for using polar codes to enhance data transmission reliability.

BACKGROUND

In a data communication system, data are transmitted over a channel from a transmitter to a receiver. Transmitted data are subject to degradation due to noise in the channel, such that the data that are received may not be identical to the data that were transmitted. The implementation of the transmitter and receiver depends upon the channel over which the data are to be transmitted, e.g. whether the channel is wireless, a cable, or an optical fiber.

Forward error correction codes (FECs) provide reliable communications in a one-directional channel by enabling a receiver to detect and correct a limited number of errors. Two basic types of FECs are block FECs and convolution FECs. Block FECs split the data into blocks, each of which is independently encoded (i.e., independently of other blocks) prior to transmission. In convolutional FECs, the encoded data depend on both the current and previous data. in digital communication scheme.

FECs are extremely important in data transmission systems. For example, in high-throughput optical transmission systems, it is not uncommon for forward error correction to consume more than half of the power in optical digital processing (oDSP). It is, therefore, highly desirable to design FECs with high coding gain and low power consumption.

There are many techniques for designing FECs, and many types of FECs are known in the art (e.g., algebraic code, convolutional turbo code, low-density parity-check (LDPC) code, turbo product codes (TPC), etc.). In 2009, Arikan introduced a kind of block FEC known as "polar codes," in E. Arikan, "Channel Polarization: A method for Constructing Capacity Achieving Codes for Symmetric Binary-Input Memoryless Channels," *IEEE Trans. Inf. Theory*, vol. 55, no. 7, pp. 3051-3073 (July 2009). A polar code is a linear block code that "polarizes" the capacity of bit channels. The bit channels polarize such that their capacities either approach one (i.e., a perfect channel) or zero (a completely noisy channel). Data are then sent through the bit channels that have capacities near one, while predetermined constant bit values are sent over bit channels that have a capacity near zero (these are referred to as "frozen" bits, since their values do not vary). Arikan was able to show that, as the code length (i.e., the number of bit channels) approaches infinity, the number of bit channels with capacity one, divided by the total number of bit channels, approaches the channel capacity—i.e., the theoretical maximum rate for the channel (also known as the "Shannon capacity").

The polar code decoding algorithm proposed by Arikan is known as "successive-cancellation" (SC) decoding, which can be effectively represented as a binary tree search. Although SC decoding displays excellent performance as the length of the code approaches infinity, its performance with short- and medium-length codes is disappointing. Accordingly, many alternative decoding algorithms have been proposed. One of the most frequently cited of these alternatives, known as "successive-cancellation list" (SCL) decoding was introduced in I. Tal and A. Vardy, "List Decoding of Polar Codes," *IEEE Trans. Inf. Theory*, vol. 61, no. 5, pp. 2213-2226 (May 2015). SCL decoding combines list decoding (a decoding technique that has been known since the 1950s) with SC decoding of polar codes, to produce an algorithm that, instead of looking at a single candidate codeword (as is done in SC decoding), examines a "list" of the L most probable candidate codewords. SCL decoding of polar codes, combined with a cyclic redundancy check (CRC—a class of error detection codes known since 1961), has been shown to have error correction performance comparable to low-density parity-check codes.

Polar codes are the first and, at present, the only class of codes that can be analytically proven to be able to achieve channel capacity within an implementable complexity. While polar codes have this theoretical advantage over other known FECs, in terms of practical implementation, many challenges remain. It would, therefore, be desirable to develop methods of using polar coding techniques having increased coding gain and high throughput.

SUMMARY

Advantageously, the present disclosure provides an encoder and a decoder that use multiple polar codes in parallel and with cooperation between them. This cooperation provides improvements in gain compared to a conventional polar code, and using parallel polar codes increases the total throughput. The disclosed technology may, therefore, be seen as improving the reliability and throughput of digital communications as well as the equipment employed for such communications.

In accordance with one aspect of the present disclosure, the technology is implemented as a method for encoding p bits for transmission across a communication channel. The method includes dividing the p bits between (used in the sense of "among" and not intended to indicate two and only two) m parallel polar codes such that each of the m parallel polar codes includes a plurality of information bits, and splitting or dividing the information bits in each of the m parallel polar codes into a private part and a public part, the public part including an information section and a repetition section, wherein the information bits of the public part are arranged in the information section. The method further includes repeating bits in the information section of the public part of each of the m parallel polar codes in the repetition section of the public part of another of the m parallel polar codes, arranging a plurality of frozen bits in each of the m parallel polar codes, and generating a polar encoded codeword for each of the m parallel polar codes.

In some implementations, the information bits in the private part of each of the m parallel polar codes are arranged in the most reliable bit positions of each of the m parallel polar codes. In some implementations, the information bits in the public part of each of the m parallel polar codes are arranged in bit positions that are less reliable than the bit positions of the private part of each of the m parallel polar codes. In some implementations, the bits of the repetition section of the public part of each of the m parallel polar codes are arranged in bit positions that are less reliable than the bit positions of the information section of the public portion of each of the m parallel polar codes. The frozen bits are in the least reliable bit positions.

In some implementations, each of the m parallel polar codes includes a first CRC of the information bits in that parallel polar code. In certain of these implementations, each of the m parallel polar codes further includes a second CRC of the information bits in the public part of that parallel polar code.

In some implementations, the method further includes dividing the information section of the public part of each of the m parallel polar codes into blocks, each block including at least one bit. Repeating bits in the information section of the public part of each of the m parallel polar codes includes interleaving the plurality of blocks of the information section of the public part of each of the m parallel codes in the repetition sections of others of the m parallel polar codes according to a predetermined interleaving scheme. In some implementations, the predetermined interleaving scheme includes arranging sequential blocks of the information section of the public part of a parallel polar code diagonally in the repetition sections of the public parts of subsequent parallel polar codes of the m parallel polar codes.

In another aspect, the technology is implemented in a method for iteratively decoding m polar coded codewords received over a communication channel, each of the codewords encoding information bits arranged as a private part, and a public part, the public part including an information section and a repetition section. The method includes iteratively repeating a horizontal decoding phase and a vertical decoding phase until all the m parallel polar codewords have been marked as correctly decoded or reaches a maximum allowed number of iterations. The horizontal decoding phase includes: decoding each of the codewords that has not yet been marked as correctly decoded using a CRC-assisted successive-cancellation polar decoder that treats as frozen any bits in that codeword that have been marked as frozen, as well as the frozen bits of the polar code to generate a decoded codeword; and performing at least one CRC check on each of the decoded codewords. The vertical decoding phase includes: marking as correctly decoded a first codeword that passed the at least one CRC check in the horizontal decoding phase; and marking as frozen in at least a second codeword all bits that are repeated from bits in the public part of the first codeword. In some implementations, decoding each of the codewords that has not yet been marked as correctly decoded using a CRC-assisted successive-cancellation polar decoder is performed in parallel.

In some implementations, marking as correctly decoded a first codeword that passed the at least one CRC check further includes determining whether information in the information section of the public part of the first codeword matches information in the repetition section of the public part of a second codeword in which the information was repeated and that passed the at least one CRC check, and marking both the first codeword and the second codeword as correctly decoded if the information matches. In some implementations, performing at least one CRC check on each of the decoded codewords includes performing a first CRC check on the information bits of each of the decoded codewords and performing a second CRC check on the bits of the public part of each of the decoded codewords.

In another aspect, the disclosed technology is implemented as an encoder that encodes p bits for transmission across a communication channel. The encoder includes circuitry configured to: divide the p bits between m parallel polar codes such that each of the m parallel polar codes includes a plurality of information bits; split the information bits in each of the m parallel polar codes into a private part and a public part, the public part including an information section and a repetition section, wherein the information bits of the public part are arranged in the information section; repeat bits in the information section of the public part of each of the m parallel polar codes in the repetition section of the public part of at least a second one of the m parallel polar codes; arrange a plurality of frozen bits in each of the m parallel polar codes; and generate a polar encoded codeword for each of the m parallel polar codes. In some implementations, the circuitry includes at least one processor and a memory storing programmed instructions that when executed by the at least one processor cause the at least one processor to encode the p bits.

In some implementations, the encoder further includes first CRC circuitry that computes a first cyclic redundancy check code over the information bits of each of the m parallel polar codes. In some implementations, the encoder includes second CRC circuitry that computes a second cyclic redundancy check code over the information bits in the public part of each of the m parallel polar codes.

In yet another aspect, the disclosed technology is implemented as a decoder that decodes m polar coded codewords received over a communication channel, each of the codewords encoding information bits arranged as a private part, and a public part, the public part including an information section and a repetition section. The decoder includes circuitry configured to iteratively repeat a horizontal decoding phase and a vertical decoding phase until all of the m parallel polar codewords have been marked as correctly decoded, or a maximum number of iterations is reached. The horizontal decoding phase includes: decoding each of the codewords that has not yet been marked as correctly decoded using a CRC-assisted successive-cancellation polar decoder that treats as frozen any bits in that codeword that have been marked as frozen, as well as the frozen bits of the polar code to generate a decoded codeword; and performing at least one CRC check on each of the decoded codewords. The vertical decoding phase includes marking as correctly decoded a first codeword that passed the CRC checks in the horizontal decoding phase, and marking the bits that are repeated from bits in the public part of the first codeword as frozen in other codewords. In some implementations, the circuitry includes at least one processor and a memory storing programmed instructions that when executed by the at least one processor cause the at least one processor to decode the m polar coded codewords.

In some implementations, the circuitry configured to mark as correctly decoded a first codeword that passed the CRC checks in the vertical phase is further configured to determine whether information in the information section of the public part of the first codeword matches information in the repetition section of the public part of a second codeword in which the information was repeated and that passed the at least one CRC check. The circuitry is configured to mark both the first codeword and the second codeword as correctly decoded if the information matches.

BRIEF DESCRIPTION OF THE FIGURES

The features and advantages of the present disclosure will become apparent from the following detailed description, taken in combination with the appended drawings, in which.

Figure 1:
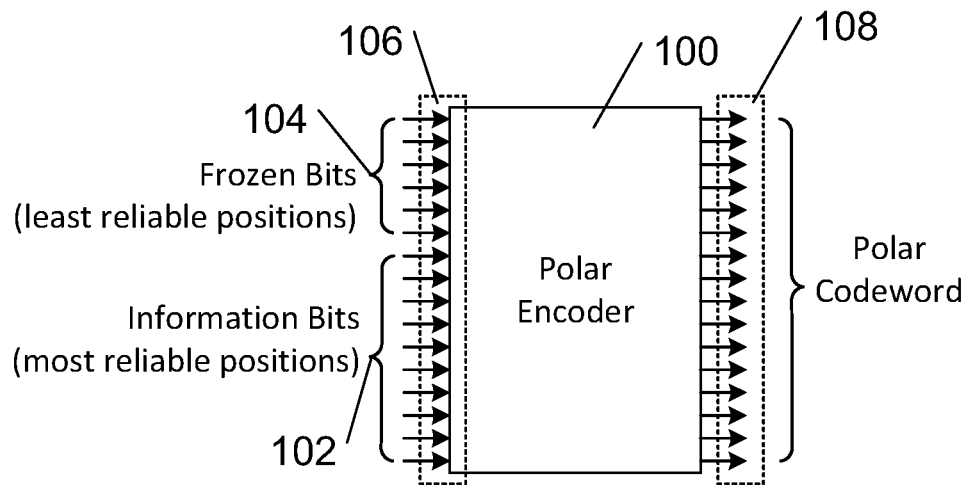
FIG. 1 shows an encoder for a polar code such as may be used for polar encoding in the disclosed technology.

It is to be understood that throughout the appended drawings and corresponding descriptions, like features are identified by like reference characters. Furthermore, it is also to be understood that the drawings and ensuing descriptions are intended for illustrative purposes only and that such disclosures are not intended to limit the scope of the claims.

DETAILED DESCRIPTION

Various representative embodiments of the disclosed technology will be described more fully hereinafter with reference to the accompanying drawings. The present technology may, however, be embodied in many different forms and should not be construed as limited to the representative embodiments set forth herein. In the drawings, the sizes and relative sizes of layers and regions may be exaggerated for clarity. Like numerals refer to like elements throughout.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. By contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). Additionally, it will be understood that elements may be "coupled" or "connected" mechanically, electrically, communicatively, wirelessly, optically, and so on, depending on the type and nature of the elements that are being coupled or connected.

The terminology used herein is only intended to describe particular representative embodiments and is not intended to be limiting of the present technology. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The functions of the various elements shown in the figures, including any functional block labeled as a "processor," may be provided through the use of dedicated hardware as well as hardware capable of executing instructions, in association with appropriate software instructions. When provided by a processor, the functions may be provided by a single dedicated processor, by a single shared processor, or by a plurality of individual processors, some of which may be shared. In some implementations of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, an application-specific integrated circuit (ASIC), a field-programmable gate array (FPGA), a read-only memory (ROM) for storing software, a random access memory (RAM), and non-volatile storage. Other hardware, conventional and/or custom, may also be included.

Software modules, or simply modules or units which are implied to be software, may be represented herein as any combination of flowchart elements or other elements indicating the performance of process steps and/or textual description. Such modules may be executed by hardware that is expressly or implicitly shown. Moreover, it should be understood that a module may include, for example, but without limitation, computer program logic, computer program instructions, software, stack, firmware, hardware circuitry, or a combination thereof, which provides the required capabilities. It will further be understood that a "module" generally defines a logical grouping or organization of related software code or other elements as discussed above, associated with a defined function. Thus, one of ordinary skill in the relevant arts will understand that particular code or elements that are described as being part of a "module" may be placed in other modules in some implementations, depending on the logical organization of the software code or other elements, and that such modifications are within the scope of the disclosure as defined by the claims.

It should also be noted that as used herein, the term "optimize" means to improve. It is not used to convey that the technology produces the objectively "best" solution, but rather that an improved (in at least one respect) solution is produced. In the context of memory access, it typically means that the efficiency or speed of memory access may be improved.

As used herein, the term "determine" generally means to make a direct or indirect calculation, computation, decision, finding, measurement, or detection. In some cases, such a determination may be approximate. Thus, determining a value indicates that the value or an approximation of the value is directly or indirectly calculated, computed, decided upon, found, measured, detected, etc. If an item is "predetermined" it is determined at any time prior to the instant at which it is indicated to be "predetermined."

The present technology may be implemented as a system, a method, and/or a computer program product. The computer program product may include a computer-readable storage medium (or media) storing computer-readable program instructions that, when executed by a processor, cause the processor to carry out aspects of the disclosed technology. The computer-readable storage medium may be, for example, an electronic storage device, a magnetic storage device, an optical storage device, an electromagnetic storage device, a semiconductor storage device, or any suitable combination of these. A non-exhaustive list of more specific examples of the computer-readable storage medium includes: a portable computer disk, a hard disk, a random access memory (RAM), a read-only memory (ROM), a flash memory, an optical disk, a memory stick, a floppy disk, a mechanically or visually encoded medium (e.g., a punch card or bar code), and/or any combination of these. A computer-readable storage medium, as used herein, is to be construed as being a non-transitory computer-readable medium. It is not to be construed as being a transitory signal, such as radio waves or other freely propagating electromagnetic waves, electromagnetic waves propagating through a waveguide or other transmission media (e.g., light pulses passing through a fiber-optic cable), or electrical signals transmitted through a wire.

It will be understood that computer-readable program instructions can be downloaded to respective computing or processing devices from a computer-readable storage medium or to an external computer or external storage device via a network, for example, the Internet, a local area network, a wide area network and/or a wireless network. A network interface in each computing/processing device may receive computer-readable program instructions via the network and forwards the computer-readable program instructions for storage in a computer-readable storage medium within the respective computing or processing device. Computer-readable program instructions for carrying out operations of the present disclosure may be assembler instructions, machine instructions, firmware instructions, configuration data for integrated circuitry, or either source code or object code written in any combination of one or more programming languages.

All statements herein reciting principles, aspects, and implementations of the present technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable program instructions. These computer-readable program instructions may be provided to a processor or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowcharts, flow diagrams, state transition diagrams, pseudo-code, and the like.

The computer-readable program instructions may also be loaded onto a computer, other programmable data processing apparatus or other devices to cause a series of operational steps to be performed on the computer, other programmable apparatus or other devices to produce a computer-implemented process, such that the instructions which execute on the computer, other programmable apparatus, or other device implement the functions/acts specified in the flowcharts, flow diagrams, state transition diagrams, pseudo-code, and the like.

In some alternative implementations, the functions noted in flowcharts, flow diagrams, state transition diagrams, pseudo-code, and the like may occur out of the order noted in the figures. For example, two blocks shown in succession in a flowchart may, in fact, be executed substantially concurrently, or the blocks may sometimes be executed in the reverse order, depending upon the functionality involved. It will also be noted that each of the functions noted in the figures, and combinations of such functions can be implemented by special-purpose hardware-based systems that perform the specified functions or acts or by combinations of special-purpose hardware and computer instructions.

With these fundamentals in place, we will now consider some non-limiting examples to illustrate various implementations of aspects of the present disclosure.

FIG. 1 shows an encoder 100 for a polar code. As discussed above, a polar code is a linear block code that "polarizes" the capacity of bit channels (which may also be referred to as sub-channels), such that their capacities either approach one (i.e., a perfect channel) or zero (a completely noisy channel). Information bits 102 are then sent via the bit channels that have capacities near one, while frozen bits 104—predetermined constant bit values—are sent over bit channels that have a capacity near zero.

A polar encoder 100 generally encodes input bits, including information bits 102 and frozen bits 104, that have a total block length of $N=2^n$, where n is an integer. This may be referred to an (N, k) polar code, with k information bits (i.e., information bits 102) and N encoded bits (leaving N-k frozen bits 104). In general, an (N, k) polar code can be defined by an N×N generator matrix G, where:

$$G = \begin{bmatrix} 1 & 1 \\ 0 & 1 \end{bmatrix}^{\otimes n}$$

In the above formulation, $[\cdot]^{\otimes n}$ denotes the n-fold Kronecker power. Where the input bits 106 are denoted $u=[u_1, u_2, \ldots, u_N]^T$ and the encoded bits 108 (collectively referred to as the "codeword" x) are denoted $x=[x_1, x_2, \ldots, x_N]^T$, the codeword is given by x=GBu, where B denotes an N×N bit-reversal permutation matrix. This operation takes place within the polar encoder 100.

It will be understood that the generator matrix G is only one generator matrix that results in polarization, and that other generator matrices are also known to produce such polarization. Additionally, although the frozen bits 104 are shown as being located at the front of the input bits 106, they will, in fact, be scattered throughout the input bits 106.

It will further be understood that complete polarization of the channels is only achieved at the limit as N→∞. For small and mid-sized code lengths N, a polar code will produce channels having a range of capacities, which, while still generally polarized toward either 1 (i.e., a perfect channel) or 0 (i.e., a completely noisy channel), will not reach either of these limits. Thus, for real-world polar coding, we want to place the k information bits 102 in the k most reliable (i.e., highest capacity) locations in u. The N-k frozen bits 104 are placed in the locations in u having the lowest reliability and are assigned fixed values known to both the encoder 100 and the decoder (not shown in FIG. 1). Reliability in the real world is a matter of degree, but it is possible and practical to distinguish reliable (that is, more reliable) locations from unreliable (less reliable) locations.

Figure 2:
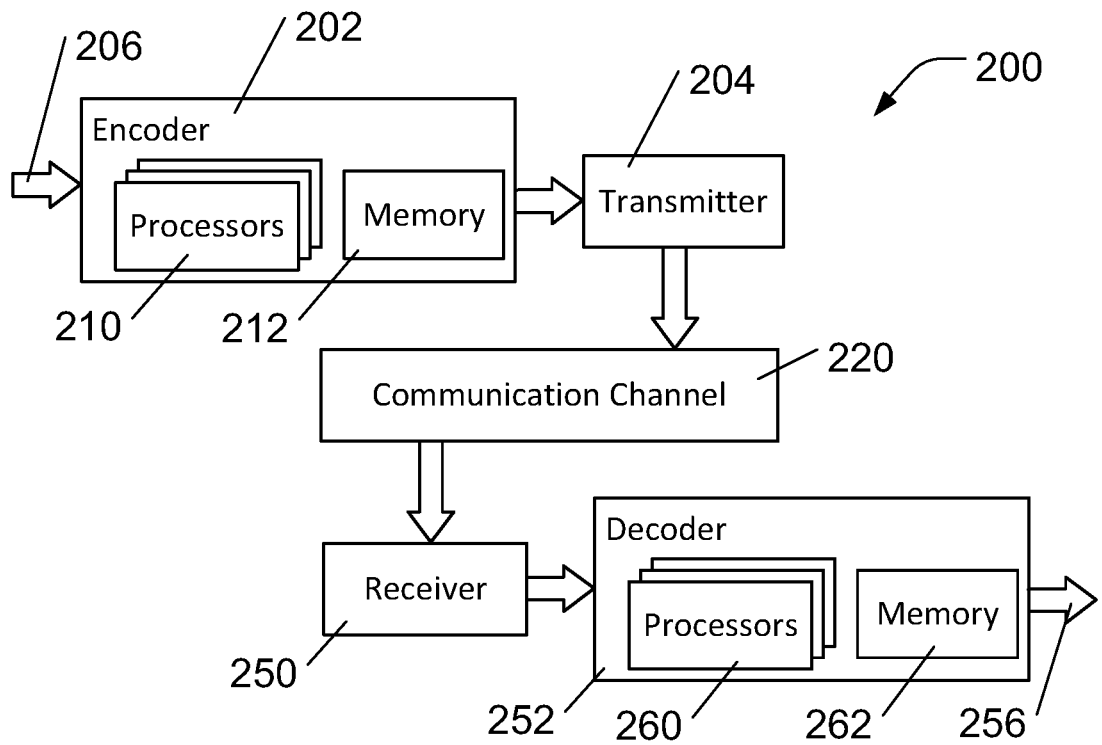
FIG. 2 is a block diagram of a communication system in which the technology of the present disclosure may be implemented.

FIG. 2 is a block diagram of a communication system 200 in which the technology of the present disclosure may be implemented. The communication system includes an encoder 202 and transmitter 204, a communication channel 220, and a receiver 250 and decoder 252.

As already discussed, the communication channel 220 may be, for example, a wireless communication channel, a cable, or an optical fiber. It will be understood that there may be noise or interference on the communication channel 220. As a result of this noise or interference, some of the bits received at the receiver 250 may have been altered during transmission, and therefore may not be the same as the bits that were transmitted over the communication channel 220 by the transmitter 204.

The encoder 202 receives blocks of information to be transmitted at its input 206, encodes the information according to an implementation of the disclosed technology as described below to produce codewords for transmission over the communication channel 220, and forwards the codewords to the transmitter 204 for transmission over the communication channel 220. In some implementations, the encoder 202 includes one or more processors 210 and a memory 212 that includes programmed instructions that cause the processors 210 to encode the information as described below. It will be understood that in some implementations, the encoder 202 may include alternative or additional hardware or circuitry, e.g., in one or more chipsets, microprocessors, digital signal processors, optical processors, optical digital signal processors, application-specific integrated circuits (ASIC), field-programmable gate arrays (FPGAs), dedicated logic circuitry, or combinations thereof to encode the information as described below.

The transmitter 204 transmits the codewords over the communication channel 220. Accordingly, the configuration of the transmitter 204 will depend on the nature of the communication channel 220. In general, the transmitter 204 is or may be a conventional transmitter for the communication channel 220. Accordingly, while not shown, the transmitter 204 may include modules for post-encoding processing, as well as modules or components of a transmit chain for the communication channel 220, such as modulators, amplifiers, multiplexers, light sources (e.g., for optical communication), antennas (e.g., for wireless communication), and/or other modules or components of a conventional transmitter.

Similarly, the receiver 250 receives codewords via the communication channel 220. Thus, details of the configuration of the receiver 250 will depend on the nature of the communication channel 220. The receiver 250 is a conventional receiver for the communication channel 220 and may include a variety of modules and components of a conventional receive chain (not shown), as well as components (not shown) used for any pre-decoding processing. For example, these modules and components may include antennas (e.g., for wireless communication), optical sensors or detectors (e.g., for optical communication), demodulators, amplifiers, demultiplexers, and/or other modules or components of a conventional receive chain. Codewords received by the receiver 250 are forwarded to the decoder 252.

The decoder 252 receives codewords from the receiver 250 and decodes the codewords according to an implementation of the disclosed technology as described below to produce received information which is provided by the decoder as output 256. In some implementations, the decoder 252 includes one or more processors 260 and a memory 262 that includes programmed instructions that cause the processors 260 to decode the information as described below. It will be understood that in some implementations, the decoder 252 may include alternative or additional hardware or circuitry, e.g., in one or more chipsets, microprocessors, digital signal processors, optical processors, optical digital signal processors, application-specific integrated circuits (ASIC), field-programmable gate arrays (FPGAs), dedicated logic circuitry, or combinations thereof to decode the information as described below.

Figure 3:
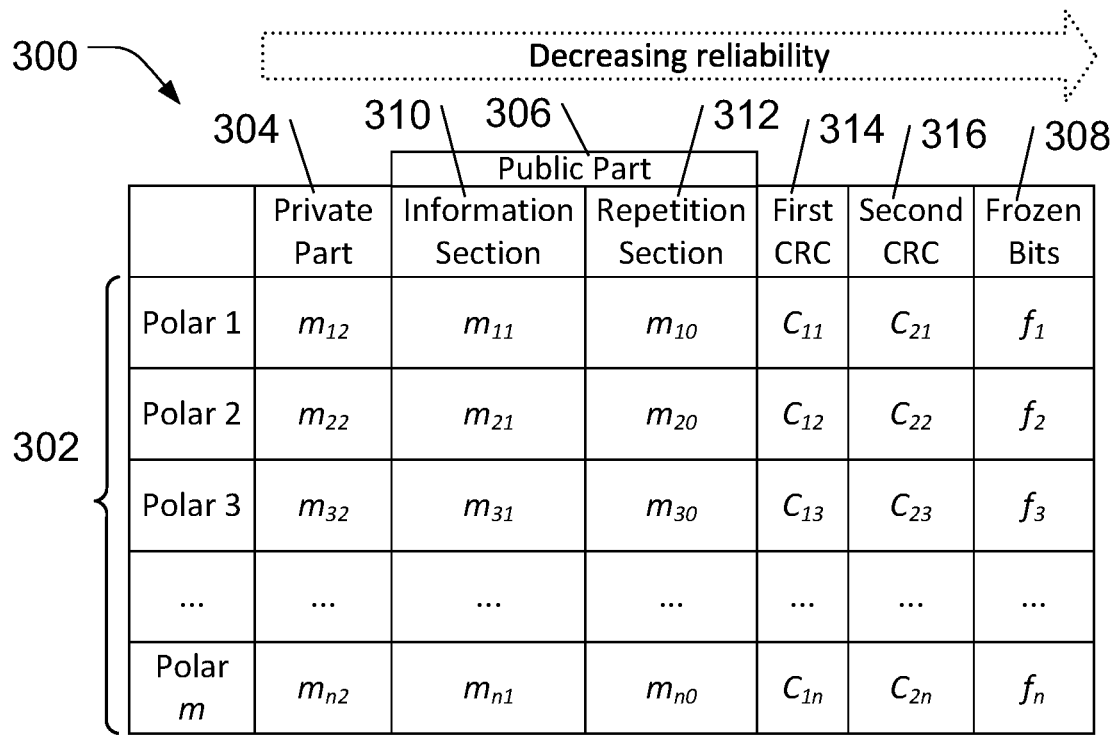
FIG. 3 shows the structure of parallel polar codes in accordance with an implementation of the disclosed technology.

FIG. 3 illustrates a structure 300 of parallel polar codes in accordance with the present disclosure. As shown, there are m parallel polar codes 302 (shown along the vertical axis as Polar 1-Polar m). The polar coded information is shown along the horizontal axis, with the most reliable bits at the left, and decreasing reliability of positions from left to right. The information bits in each polar code are divided (e.g., separated or distributed) into two parts, referred to as a "private" part 304 (labeled $m_{12}$-$m_{n2}$ and a "public" part 306 (which may also be referred to as a "shared" part). The data in the private part 304 appears in only a single one of the parallel polar codes 302, while each bit in the public part 306 will be repeated in at least the public part 306 of second one of the parallel polar codes 302. Thus, the public part 306 can be seen as being encoded using both a polar code (i.e., along the horizontal axis) and a repetition code (i.e., along the vertical axis). Additionally, each of the m polar codes 302 includes frozen bits 308 (labeled $f_1$-$f_n$).

As can be seen by their positions along the horizontal axis, the private part 304 is placed in the most reliable bit positions (i.e., the bit channels with capacities closest to one) in each polar code, followed by the public part 306, and the frozen bits 308, which are placed in the least reliable bit positions (i.e., the bit channels with capacities closest to zero). The public part 306 of each polar code is divided into an information section 310 (labeled $m_{11}$-$m_{n1}$), which occupies the more reliable bit positions in the public part 306, and a repetition section 312 (labeled $m_{10}$-$m_{n0}$), in the less reliable bit positions in the public part 306. The information section 310 contains the public part of the information encoded in each of the parallel polar codes 302, while the repetition section 312 contains bits repeated from other ones of the information sections 310 of the public parts 306 of the parallel polar codes 302. This repetition of bits can be achieved in some implementations using interleaving, as will be discussed below.

Decoding may entail one or more iterations. Advantageously when one polar code is correctly decoded in one iteration of decoding, the information that has been decoded in the public part 306 can be used to assist in the decoding of other parallel polar codes 302 in later decoding iterations. In some implementations, when checks (described below) have been performed to confirm that a polar code has been correctly decoded, the bits of the public part 306 can be treated as "frozen" (i.e., known) in later decoding iterations, which may increase the error correction capability of each of the parallel polar codes 302. By placing the public part 306, and particularly the repetition section 312, in less reliable bits, the benefit of being able to treat these bits as "frozen" in later iterations is increased, since we are replacing relatively low capacity bit channels with "frozen" information, which is already known. It will further be understood that when using an SCL decoding algorithm, frozen bits lead to a reduction in the probability of error, further adding to the benefits of being able to treat more bits as "frozen."

In addition to the information bits (including private part 304 and public part 306) and frozen bits 308, in some implementations each of the parallel polar codes 302 includes two CRCs: a first CRC 314 (labeled $C_{11}$-$C_{1n}$) for all of the information (i.e., the private part 304 and public part 306), and a second CRC 316 (labeled $C_{21}$-$C_{2n}$) for just the public part 306. As will be discussed below, these CRCs are used during decoding to check whether decoding has been successful. It will be understood that although two CRCs are shown in this implementation, it is also possible to use only a single CRC, or more than two CRCs. Additionally, although the first CRC 314 and the second CRC 316 are shown in this implementation as occupying less reliable bits in each of the parallel polar codes 302, the CRCs could be placed in other positions in the polar codes, or could be scattered or interleaved within each of the parallel polar codes 302.

Figure 4:
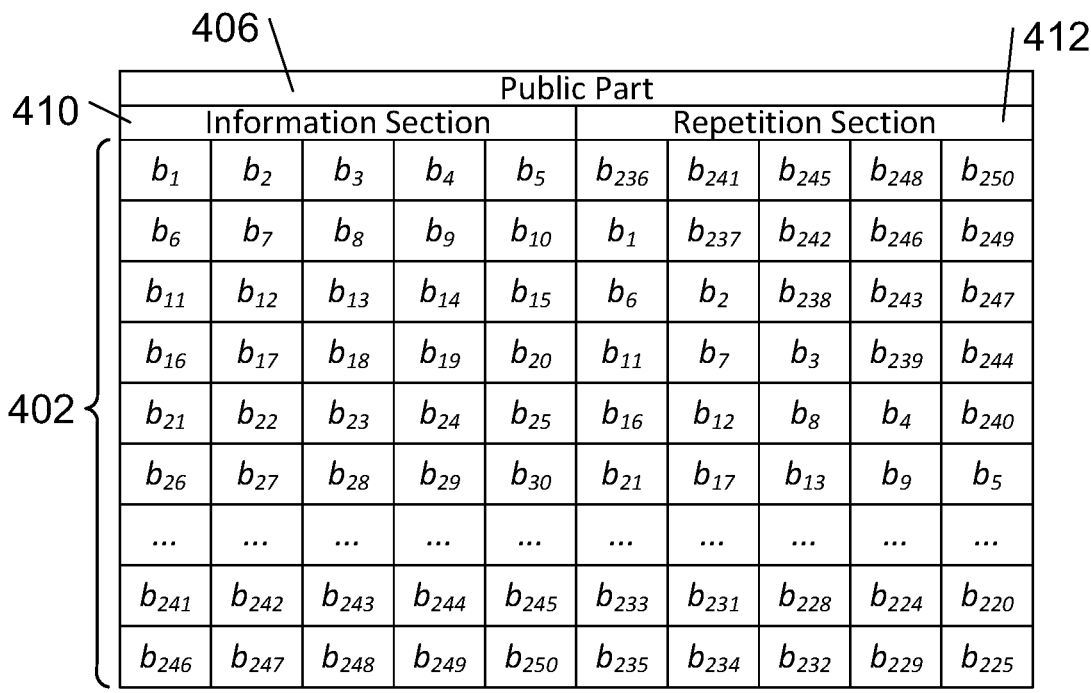
FIG. 4 shows an example of an interleaving scheme for the public parts of the parallel polar codes of an implementation of the disclosed technology.

FIG. 4 shows an example of an interleaving scheme for the public parts of the parallel polar codes. In the example shown in FIG. 4, there are fifty parallel polar codes 402 shown along the vertical axis (i.e., m=50), and the public part 406 includes an information section 410 containing five blocks of bits and a repetition section 412 containing five blocks of bits. With fifty parallel polar codes 402, each of which contains five blocks of bits in the information section 410 of its public part 406, there are a total of 250 blocks of information bits encoded in the public part 406 of the parallel polar codes 402.

In the interleaving shown in FIG. 4, the 250 blocks of information, $b_1$-$b_{250}$, are arranged (or sorted or put in order) sequentially in the information sections 410 of the parallel polar codes 402, and diagonally in the repetition sections 412 of the parallel polar codes 402. This interleaving provides for each of the blocks of information to be included in two of the parallel polar codes 402 (once in the information section 410, and once in the repetition section 412 of a different one of the parallel polar codes 402). Additionally, the public part 406 of each polar code has shared information with ten other polar codes in the fifty parallel polar codes 402.

It will be understood that FIG. 4 shows only one example, and that other interleaving schemes, involving differing numbers of parallel polar codes and differing numbers of blocks of bits may be used in accordance with the disclosed technology. In general, interleaving schemes in which each bit in the information section of the public part appears in the repetition section of at least one other parallel polar code will provide at least some benefit with respect to decoding. It will be understood that some interleaving schemes may repeat bits from the information section of the public part in more than one other parallel polar code. Additionally, interleaving schemes may be used in which the public part of each polar code may share information with as few as one other polar code in the parallel polar codes, with as many other polar codes as the number of bits in the public portion, or any number of other polar codes between these.

Figure 5:
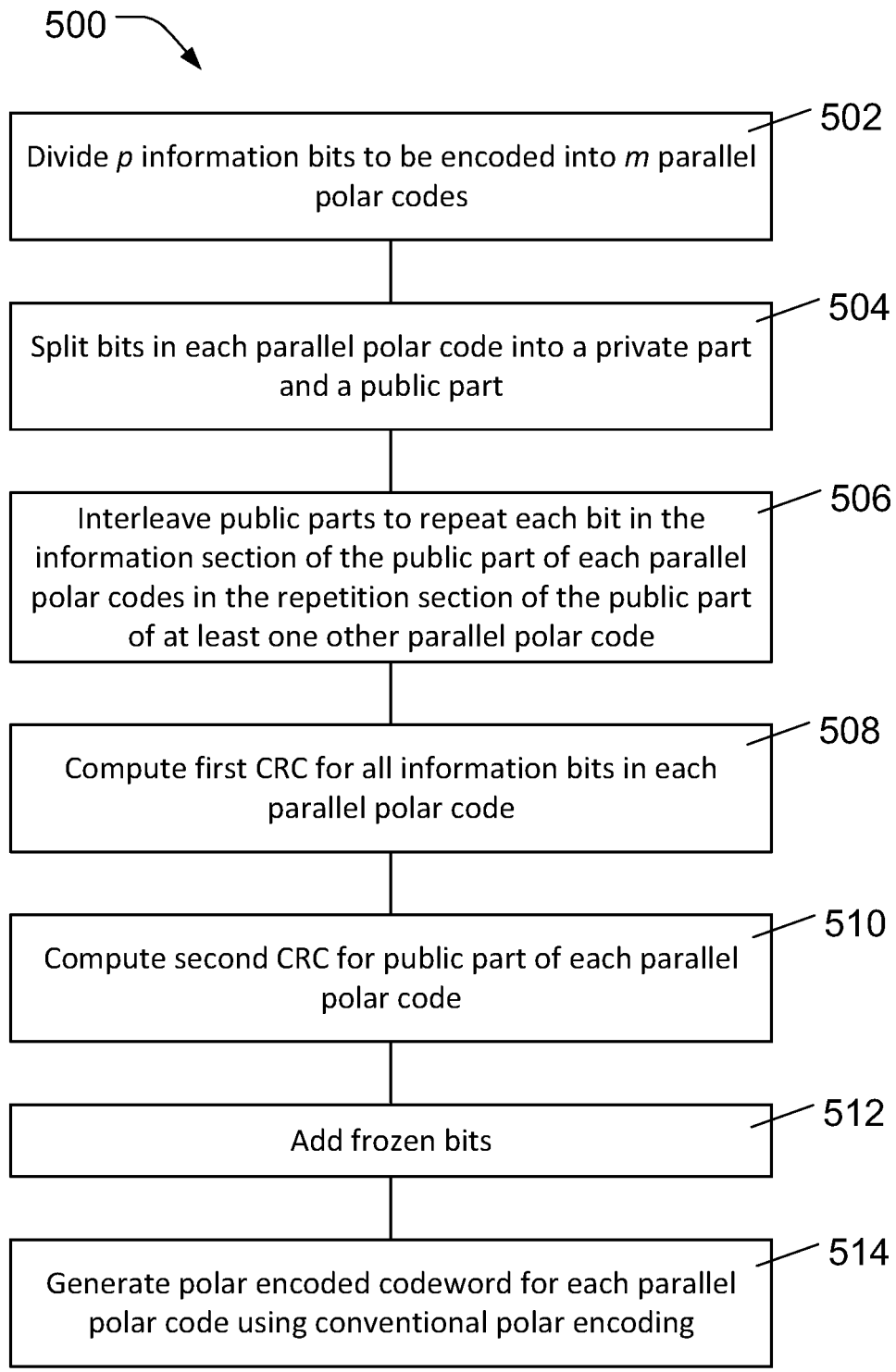
FIG. 5 is a flowchart of an encoding method in accordance with an implementation of the disclosed technology.

FIG. 5 shows a flowchart 500 of an encoder in accordance with an implementation of the disclosed technology. The encoder accepts p information bits and uses m parallel polar codes to encode the information. In block 502, the encoder divides the p bits of information to be encoded into m portions, each of which will be encoded in one of the m parallel polar codes. In general, p and m may be selected so that this division results in an equal whole number of bits of information to be encoded in each of the parallel polar codes. Alternatively, the p information bits may be padded to achieve such a division of the bits.

In block 504, the p/m information bits for each polar code are split into a private part and a public part. This split is performed such that information bits are placed in the private part and into the information section of the public part. (As used herein, the concepts of splitting and dividing are related concepts, and may overlap; the use of different terms is intended for clarity of explanation and is not intended to indicate that the concepts of splitting and dividing are fully distinct.)

In block 506, the public parts of the m parallel polar codes are interleaved to repeat each bit in the information section of the public part of each of the parallel polar codes in the repetition section of the public part of at least one other parallel polar code. To achieve this, in some implementations an interleaving scheme such as was discussed above with reference to FIG. 4 may be used, though other interleaving schemes are also possible.

In block 508, conventional methods for computing a CRC are used to compute a first CRC for all the bits in the public and private parts of each parallel polar code. These methods may include, for example, calculation of a CRC using any of known CRC-32 polynomial, such as are described in P. Koopman, "32-bit cyclic redundancy codes for Internet applications," *Proceedings International Conference on Dependable Systems and Networks*, Washington, D.C., USA, 2002, pp. 459-468, or any other known CRC method or algorithm. Similarly, in block 510, conventional methods for computing a CRC are used to compute a second CRC for the public part of each parallel polar code. These CRCs are appended to the input bits for each of the parallel polar codes.

In block 512, frozen bits are added to each of the parallel polar codes. Generally, these frozen bits may all have the same constant value of "0" or "1", and this value will be known by both the encoder and the decoder. It will be understood that in some implementations, other patterns of frozen bits may be used, provided that the value of each frozen bit is known by both the encoder and decoder. With the frozen bits, each of the parallel codes should have a predetermined size that is a power of 2 (i.e., the size of the code $N=2^n$, where n is an integer).

In block 514, a conventional polar encoding method is applied to each of the parallel polar codes to generate an encoded codeword for each of the parallel polar codes. These codewords may then be transmitted over a channel, such as a wireless channel, a cable, or an optical fiber. The polar encoding method may be an encoding method such as is described above with reference to FIG. 1, an encoding such as in described in E. Arikan, "Channel Polarization: A method for Constructing Capacity Achieving Codes for Symmetric Binary-Input Memoryless Channels," *IEEE Trans. Inf. Theory*, vol. 55, no. 7, pp. 3051-3073 (July 2009), or any other known method or algorithm for polar encoding.

Using an encoder as described with reference to FIG. 5 provides for the encoding of $m \times (l_{private}+l_{pub\_inf})$ information bits (where $l_{private}$ is the number of bits in the private part of each parallel polar code, $l_{pub\_inf}$ is the number of bits in the information section of the public part of each parallel polar code, and m is the number of parallel polar codes) in a total of $m \times (l_{private}+l_{public}+l_{CRC1}+l_{CRC2}+l_{frozen})$ encoded bits (where $l_{private}$ is the number of bits in the private part of each parallel polar code, $l_{public}$ is the total number of bits in the public part of each parallel polar code, $l_{CRC1}$ is the length of the first CRC, $l_{CRC2}$ is the length of the second CRC, $l_{frozen}$ is the number of frozen bits in each parallel polar code, and m is the number of parallel polar codes). The length of the public part of each parallel polar code, $l_{public}$, is the sum of the length of the information section and the length of the repetition section of the public part. Using an interleaving scheme such as is shown above with reference to FIG. 4, in which each block of bits in the information section of the public part is repeated in the repetition section of the public part of one other parallel polar code, the length of the information section will be the same as the length of the repetition section, and $l_{public}=2\times l_{pub\_inf}$, where $l_{public}$ is the length (in bits) of the public part of each parallel polar code, and $l_{pub\_inf}$ is the length (in bits) of the information section of the public part of each parallel polar code. In a more general case, in which each block of bits in the information section of the public part is repeated in the repetition section of q other parallel polar codes, then $l_{public}=(q+1)\times l_{pub\_inf}$, where $l_{public}$ is the length (in bits) of the public part of each parallel polar code, and $l_{pub\_inf}$ is the length (in bits) of the information section of the public part of each parallel polar code.

Figure 6:
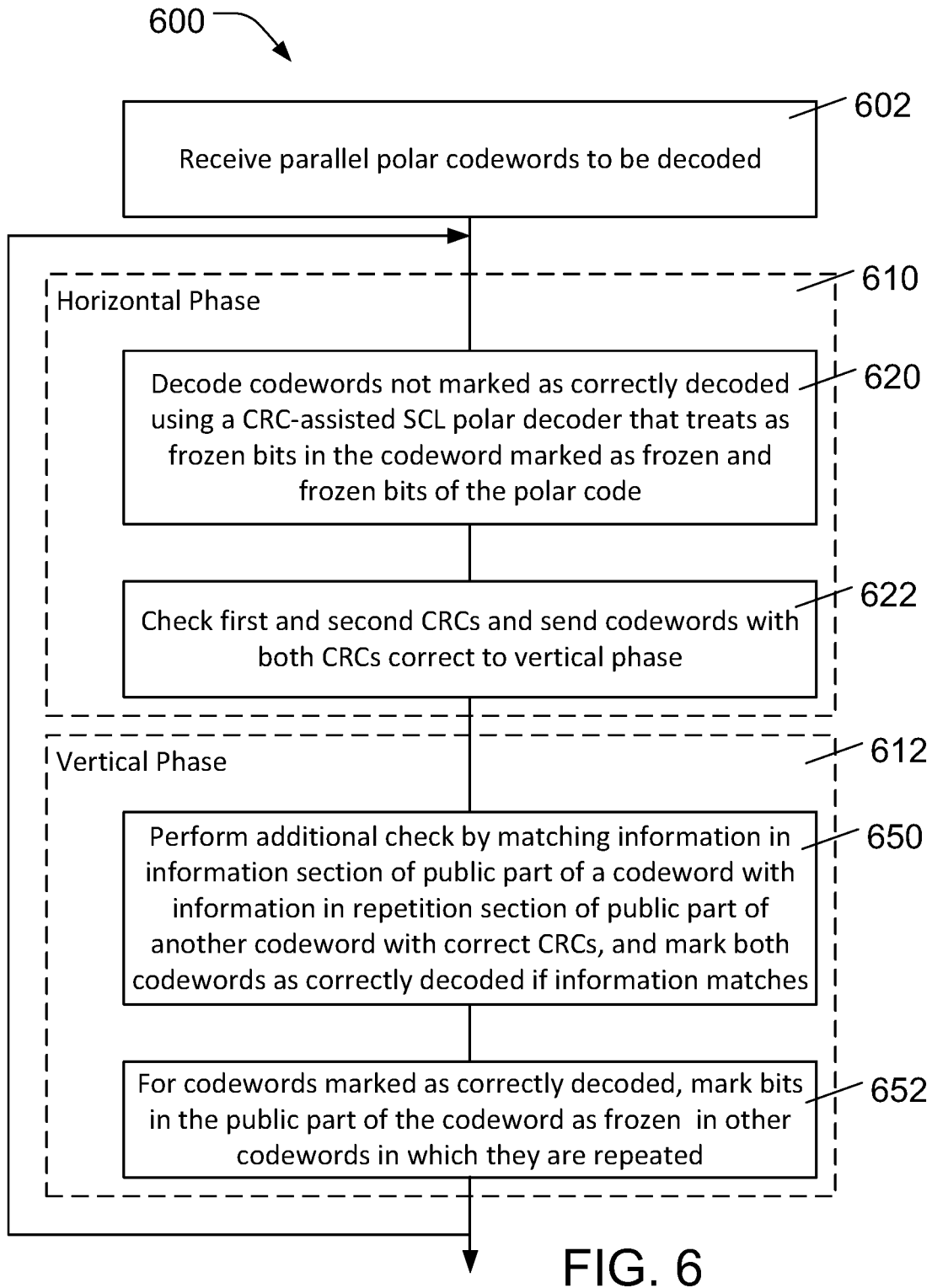
FIG. 6 is a flowchart of a decoding method in accordance with an implementation of the disclosed technology.

FIG. 6 is a flowchart 600 of a decoding method in accordance with various implementations of the disclosed technology. As is generally the case, the decoding is performed on codewords received over a noisy channel, with the goal of correctly decoding from the received codewords the information that was originally encoded and sent over the channel. Thus, in block 602, the decoder receives m parallel polar codewords to be decoded. The codewords are received over a channel, such as a wireless channel, a cable, or an optical fiber. There may have been noise or interference on the channel, meaning that some of the bits of the received codewords may have been altered during transmission, and may not be the same as the bits in the codewords that were transmitted over the channel. Accordingly, the decoder should be able to detect and (for FEC) correct these errors.

In accordance with an implementation of the disclosed technology, the decoding method is iterative, in which each iteration has two phases—a horizontal phase 610 and a vertical phase 612. The horizontal phase 610 decodes the parallel polar codes along the horizontal axis as shown above in FIGS. 3 and 4, and the vertical phase 612 uses the repetition between public parts of the parallel polar codes to effectively "freeze" bits for the next iteration. It is referred to as the "vertical" phase because it works with information from multiple polar codes of the parallel polar codes—i.e., along the vertical axis as shown above in FIGS. 3 and 4.

In block 620 of the horizontal phase 610, any of the m polar codewords that have not already been marked as correctly decoded are decoded using a known CRC-aided SCL decoder, such as is described, for example, in I. Tal and A. Vardy, "List Decoding of Polar Codes," *IEEE Trans. Inf. Theory*, vol. 61, no. 5, pp. 2213-2226 (May 2015), though other known CRC-aided SCL decoders may also be used. In some implementations, the CRC-aided SCL decoding of these codewords may be performed in parallel. As will be discussed below, the bits that are treated as "frozen" bits will vary for the codewords in each iteration, according to the public parts of the codewords that have been marked as correctly decoded during previous iterations. Marking may be accomplished by any technique, such that the marking indicates a correct (or incorrect) decoding, and it is possible to assess whether decoding was correct by checking the marking. The SCL decoder will treat as frozen any bits marked as frozen in a codeword (see below), as well as the frozen bits of the polar code (i.e., the frozen bits 308 of FIG. 3). During the first iteration, all m parallel polar codewords will be decoded using a CRC-aided SCL decoder, and only the frozen bits of the polar code will be treated as frozen.

It will be understood that for CRC-aided SCL decoding, a CRC check is used to determine which path in a list of paths is most likely to represent a decoded codeword that corresponds to the transmitted codeword (i.e., which of several possible decoded codewords is most likely to have been decoded correctly). In some implementations, the CRC check used in the CRC-aided SCL decoding may correspond to the second CRC as discussed above (in the context of encoding) in FIG. 3.

In block 622, the first and second CRCs are checked. As discussed above, the first CRC is used to check all the information bits in the codeword, while the second CRC is used to check the information in the public part of the codeword. Each of the parallel polar codewords in which both CRCs are correct are passed on to the vertical phase 612. It will be understood that in some implementations, it is possible for only a single CRC to be used (i.e., the CRC used in the CRC-aided SCL decoding), or for more than two CRCs to be used.

In block 650 of the vertical phase 612, each of the parallel polar codewords in which the CRCs are correct undergoes an additional check to determine whether the codeword has been correctly decoded, and the information in the public part of the codeword can be accepted as effectively "frozen" in a next iteration. This additional check is performed by looking at pairs of codewords for which the CRCs are correct that have information in the information section of the public part of the first codeword of the pair repeated in the repetition section of the public part of the second codeword of the pair. If the information matches in these two codewords, then both codewords are marked as correctly decoded.

It will be understood that the additional check of block 650 may not be used in some implementations, in which case codewords for which all CRCs are correct will be marked as correctly decoded. Additionally, in some implementations that use more than one repetition of each block in the information section of the public part, the matching of information in the public parts of codewords may be performed on subsets of codewords that are larger than the pairs of codewords described above.

While this additional check may be optional, it should be noted that because bits in the public part of a codeword that is marked as correctly decoded will be effectively "frozen" in other codewords that share that information, a high degree of certainty is desirable. If a codeword that has been marked as correctly decoded was not, in fact, correctly decoded, errors in the public part of that codeword could propagate to all other codewords that share information in the public part of that codeword.

In block 652, for each codeword that has been marked as correctly decoded, all the information in the public part of the codeword is marked as "frozen" in all other codewords in which it occurs, in all future iterations. As discussed above, treating these shared public parts as "frozen" increases the error correction capabilities of the code. Additionally, in SCL decoding algorithms, additional frozen bits lead to a reduction in the time and resources that are used for decoding, as well as a reduced decoding error rate.

The decoding method will continue to iterate, alternating between the horizontal phase 610 and the vertical phase 612 until either all of the parallel polar codewords are marked as correctly decoded, in which case decoding was successful, or until codewords that have not been correctly decoded remain and no further public parts of the remaining codewords can be marked as "frozen," in which case decoding has failed.

As an example of the vertical phase of decoding in accordance with various implementations of the disclosed technology, reference is again made to FIG. 4. Assume that the second and sixth parallel polar codes of the m polar codes having public parts shown in FIG. 4 have been decoded during the first iteration by the CRC-aided SCL decoder, and that both CRCs for both of these codes are correct. Since the information part of the second code includes block $b_9$, and that block is repeated in the repetition part of the sixth code, an additional check may be performed by determining whether all of the bits of block $b_9$ in the second and sixth codes match. If so, then both the second and sixth polar codes will be marked as correctly decoded, and all the bits of all the blocks in the public parts of both codes can be marked as "frozen," and treated as frozen bits in all subsequent decoding iterations. This means that all the bits in the blocks in the public part of the second code—blocks $b_6$, $b_7$, $b_8$, $b_9$, $b_{10}$, $b_1$, $b_{237}$, $b_{242}$, $b_{246}$, $b_{249}$—can be taken as "frozen", as well as all of the blocks in the public part of the sixth code—blocks $b_{26}$, $b_{27}$, $b_{28}$, $b_{29}$, $b_{30}$, $b_{21}$, $b_{17}$, $b_{13}$, $b_9$ (repeated in both), and $b_5$. Treating the bits in all of these blocks as frozen will assist the decoding of, e.g., the first parallel polar code (block $b_5$), the third code (blocks $b_6$ and $b_{13}$), the fourth code (blocks $b_7$ and $b_{17}$), the fifth code (blocks $b_8$ and $b_{21}$), etc.

Figure 7:
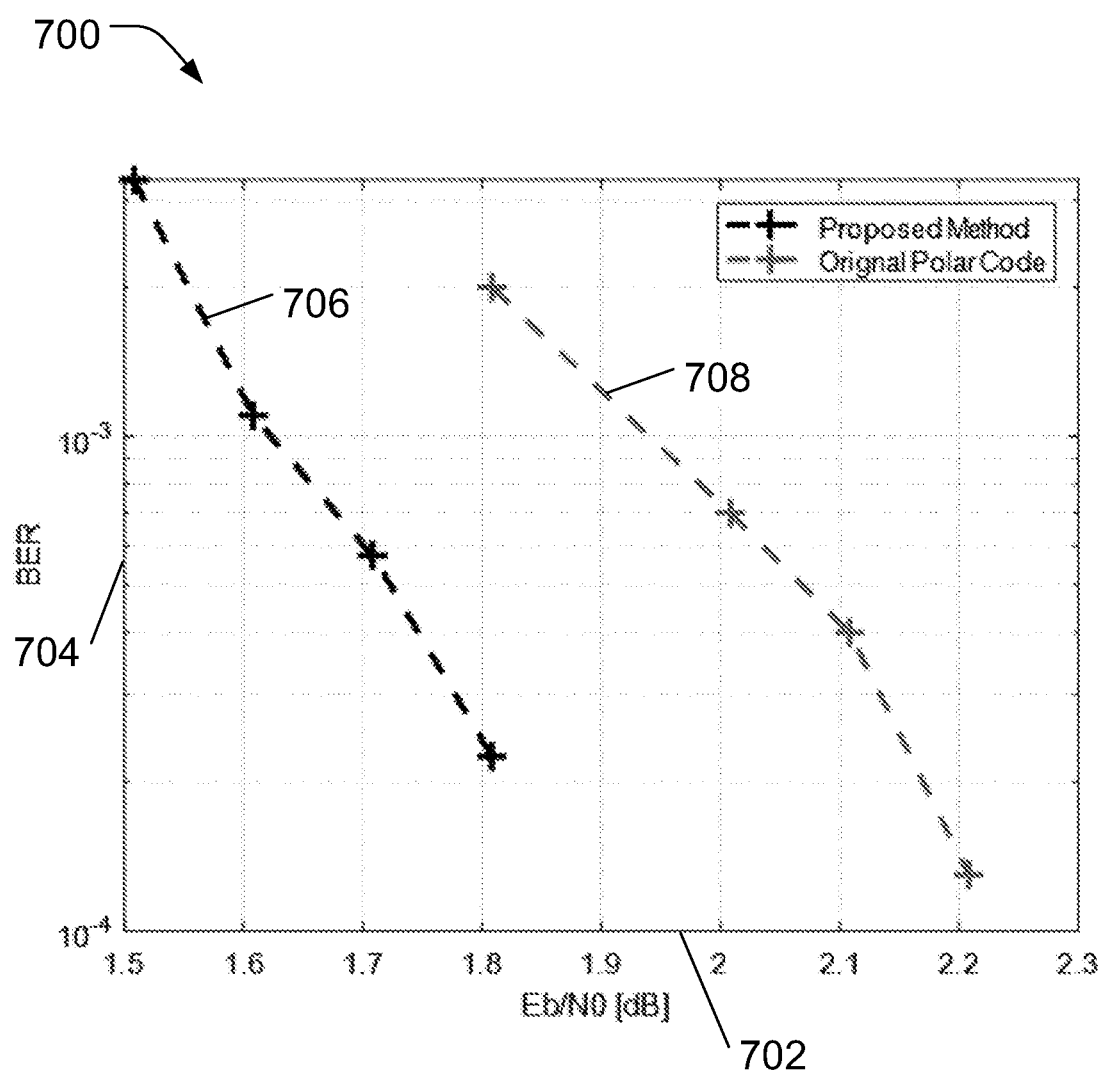
FIG. 7 shows a graph 700 of simulation results of a parallel polar coding method in accordance with an implementation of the disclosed technology.

FIG. 7 shows a graph 700 of simulation results of a parallel polar coding method in accordance with an implementation of the disclosed technology as described above ("proposed method" curve 706), compared to an original polar code ("original polar code" curve 708). For the simulation, the polar code length N was 1024 bits, with an overhead of 66.8%.

The horizontal axis 702 shows a normalized signal-to-noise ratio (SNR) in dB, also referred to as SNR per bit, expressed as an energy per bit to noise power spectral density ratio ($E_b/N_0$). The vertical axis 704 shows the bit error rate (BER).

As can be seen, the proposed method curve 706 shows an approximately 0.4 dB improvement over the original polar code curve 708. As will be understood by one skilled in the art, this represents a significant improvement in the performance of a forward error correction code.

It will be understood that, although the embodiments presented herein have been described with reference to specific features and structures, various modifications and combinations may be made without departing from such disclosures. The specification and drawings are, accordingly, to be regarded simply as an illustration of the discussed implementations or embodiments and their principles as defined by the appended claims, and are contemplated to cover any and all modifications, variations, combinations or equivalents that fall within the scope of the present disclosure.

What is claimed is:

1. A method for encoding p bits for transmission across a communication channel, the method comprising:
   dividing the p bits between m parallel polar codes such that each of the m parallel polar codes includes a plurality of information bits;
   splitting the information bits in each of the m parallel polar codes into a private part and a public part, the public part including an information section and a repetition section, wherein the information bits of the public part are arranged in the information section;
   repeating bits in the information section of the public part of each of the m parallel polar codes in the repetition section of the public part of at least a second one of the m parallel polar codes;
   arranging a plurality of frozen bits in each of the m parallel polar codes; and
   generating a polar encoded codeword for each of the m parallel polar codes.

2. The method of claim 1, wherein the information bits in the private part of each of the m parallel polar codes are arranged in the most reliable bit positions of each of the m parallel polar codes.

3. The method of claim 2, wherein the information bits in the public part of each of the m parallel polar codes are arranged in bit positions that are less reliable than the bit positions of the private part of each of the m parallel polar codes.

4. The method of claim 3, wherein the bits of the repetition section of the public part of each of the m parallel polar codes are arranged in bit positions that are less reliable than the bit positions of the information section of the public portion of each of the m parallel polar codes.

5. The method of claim 1, wherein each of the m parallel polar codes includes a first cyclic redundancy check (CRC) of the information bits in that parallel polar code.

6. The method of claim 5, wherein each of the m parallel polar codes further includes a second CRC of the information bits in the public part of that parallel polar code.

7. The method of claim 1, further comprising dividing the information section of the public part of each of the m parallel polar codes into a plurality of blocks, each block comprising at least one bit, and wherein repeating bits in the information section of the public part of each of the m parallel polar codes comprises interleaving the plurality of blocks of the information section of the public part of each of the m parallel codes in the repetition sections of others of the m parallel polar codes according to a predetermined interleaving scheme.

8. The method of claim 7, wherein the predetermined interleaving scheme includes arranging sequential blocks of the information section of the public part of a parallel polar code diagonally in the repetition sections of the public parts of subsequent parallel polar codes of the m parallel polar codes.

9. A method for iteratively decoding m polar coded codewords received over a communication channel, each of the codewords encoding information bits arranged as a private part, and a public part, the public part including an information section and a repetition section, the method comprising:
   iteratively repeating a horizontal decoding phase and a vertical decoding phase until all of the m parallel polar codewords have been marked as correctly decoded;
   wherein the horizontal decoding phase comprises:
      decoding each of the codewords that has not yet been marked as correctly decoded using a CRC-assisted successive-cancellation list polar decoder that treats as frozen any bits in that codeword that have been marked as frozen, as well as the frozen bits of the polar code to generate a decoded codeword; and
      performing at least one CRC check on each of the decoded codewords; and
   wherein the vertical decoding phase comprises:
      marking as correctly decoded a first codeword that passed the at least one CRC check in the horizontal decoding phase; and marking as frozen in at least a second codeword bits that are repeated from bits in the public part of the first codeword.

10. The method of claim 9, wherein decoding each of the codewords that has not yet been marked as correctly decoded using a CRC-assisted successive-cancellation polar decoder is performed in parallel.

11. The method of claim 9, wherein marking as correctly decoded a first codeword that passed the at least one CRC check further comprises determining whether information in the information section of the public part of the first codeword matches information in the repetition section of the public part of a second codeword in which the information was repeated and that passed the at least one CRC check, and marking both the first codeword and the second codeword as correctly decoded if the information matches.

12. The method of claim 9, wherein performing at least one CRC check on each of the decoded codewords comprises performing a first CRC check on the information bits of each of the decoded codewords and performing a second CRC check on the bits of the public part of each of the decoded codewords.

13. The method of claim 12, wherein marking as correctly decoded a first codeword that passed the at least one CRC check further comprises determining whether information in the information section of the public part of the first codeword matches information in the repetition section of the public part of a second codeword in which the information was repeated and that passed the at least one CRC check, and marking both the first codeword and the second codeword as correctly decoded if the information matches.

14. An encoder that encodes p bits for transmission across a communication channel, the encoder comprising circuitry configured to:
   divide the p bits between m parallel polar codes such that each of the m parallel polar codes includes a plurality of information bits;
   split the information bits in each of the m parallel polar codes into a private part and a public part, the public part including an information section and a repetition section, wherein the information bits of the public part are arranged in the information section;
   repeat bits in the information section of the public part of each of the m parallel polar codes in the repetition section of the public part of at least a second one of the m parallel polar codes;
   arrange a plurality of frozen bits in each of the m parallel polar codes; and
   generate a polar encoded codeword for each of the m parallel polar codes.

15. The encoder of claim 14, wherein the circuitry comprises at least one processor and a memory storing programmed instructions that when executed by the at least one processor cause the at least one processor to encode the p bits.

16. The encoder of claim 14, further comprising first CRC circuitry that computes a first cyclic redundancy check code over the information bits of each of the m parallel polar codes.

17. The encoder of claim 16, further comprising second CRC circuitry that computes a second cyclic redundancy check code over the information bits in the public part of each of the m parallel polar codes.

18. A decoder that decodes m polar coded codewords received over a communication channel, each of the codewords encoding information bits arranged as a private part, and a public part, the public part including an information section and a repetition section, the decoder comprising circuitry configured to:
   iteratively repeat a horizontal decoding phase and a vertical decoding phase until all of the m parallel polar codewords have been marked as correctly decoded;
   wherein the horizontal decoding phase comprises:
      decoding each of the codewords that has not yet been marked as correctly decoded using a CRC-assisted successive-cancellation list polar decoder that treats as frozen any bits in that codeword that have been marked as frozen, as well as the frozen bits of the polar code to generate a decoded codeword; and
      performing at least one CRC check on each of the decoded codewords; and
   wherein the vertical decoding phase comprises:
      marking as correctly decoded a first codeword that passed the at least one CRC check in the horizontal decoding phase; and
      marking as frozen in at least a second codeword bits that are repeated from bits in the public part of the first codeword.

19. The decoder of claim 18, wherein the circuitry comprises at least one processor and a memory storing programmed instructions that when executed by the at least one processor cause the at least one processor to decode the m polar coded codewords.

20. The decoder of claim 18, wherein the circuitry configured to mark as correctly decoded a first codeword that passed the at least one CRC check in the vertical phase is further configured to determine whether information in the information section of the public part of the first codeword matches information in the repetition section of the public part of a second codeword in which the information was repeated and that passed the at least one CRC check, and to mark both the first codeword and the second codeword as correctly decoded if the information matches.

* * * * *